(12) United States Patent
Rossi et al.

(10) Patent No.: US 7,982,286 B2
(45) Date of Patent: Jul. 19, 2011

(54) METHOD TO IMPROVE METAL DEFECTS IN SEMICONDUCTOR DEVICE FABRICATION

(75) Inventors: Nace Rossi, Singapore (SG); Ranbir Singh, Singapore (SG)

(73) Assignee: Agere Systems Inc., Allentown, PA (US)

( * ) Notice: Subject to any disclaimer, the term of this patent is extended or adjusted under 35 U.S.C. 154(b) by 753 days.

(21) Appl. No.: 11/427,494

(22) Filed: Jun. 29, 2006

(65) Prior Publication Data

US 2008/0014728 A1    Jan. 17, 2008

(51) Int. Cl.
*H01L 27/08* (2006.01)
(52) U.S. Cl. ............ 257/531; 257/E21.022; 438/238
(58) Field of Classification Search ............ 438/117, 438/171, 238, 381, 652–654, 656, 666, FOR. 388, 438/FOR. 405, FOR. 406, 763, FOR. 207; 257/E21.022, E21.29, 528, 531; 267/37.1, 267/37.3, 81, 87, 229
See application file for complete search history.

(56) References Cited

U.S. PATENT DOCUMENTS

| 5,480,831 | A | * | 1/1996 | Core | 438/396 |
| 5,784,189 | A | * | 7/1998 | Bozler et al. | 359/254 |
| 6,297,128 | B1 | | 10/2001 | Kim et al. | |
| 6,621,141 | B1 | * | 9/2003 | Van Schuylenbergh et al. | 257/531 |
| 6,866,255 | B2 | * | 3/2005 | Fork et al. | 267/37.1 |
| 7,229,908 | B1 | * | 6/2007 | Drizlikh et al. | 438/622 |
| 2003/0234437 | A1 | | 12/2003 | Yamamoto et al. | |

FOREIGN PATENT DOCUMENTS

JP    02-046780    *    2/1990

OTHER PUBLICATIONS

The Patent Office of the People's Republic of China Examination Report dated Nov. 7, 2008 for related Chines Application No. 200710127028.1; 12 pages.

* cited by examiner

*Primary Examiner* — Matthew Smith
*Assistant Examiner* — Quovaunda Jefferson

(57) ABSTRACT

The invention, in one aspect, provides a method of manufacturing a semiconductor device. This method includes providing a semiconductor substrate and depositing a metal layer over the semiconductor substrate that has an overall thickness of about 1 micron or greater. The metal layer is formed by depositing a first portion of the thickness of the metal layer, which has a compressive or tensile stress associated therewith over the semiconductor substrate. A stress-compensating layer is deposited over the first portion, such that the stress-compensating layer imparts a stress to the first portion that is opposite to the compressive or tensile stress associated with the first portion. A second portion of the thickness of the metal layer is then deposited over the stress-compensating layer.

23 Claims, 8 Drawing Sheets

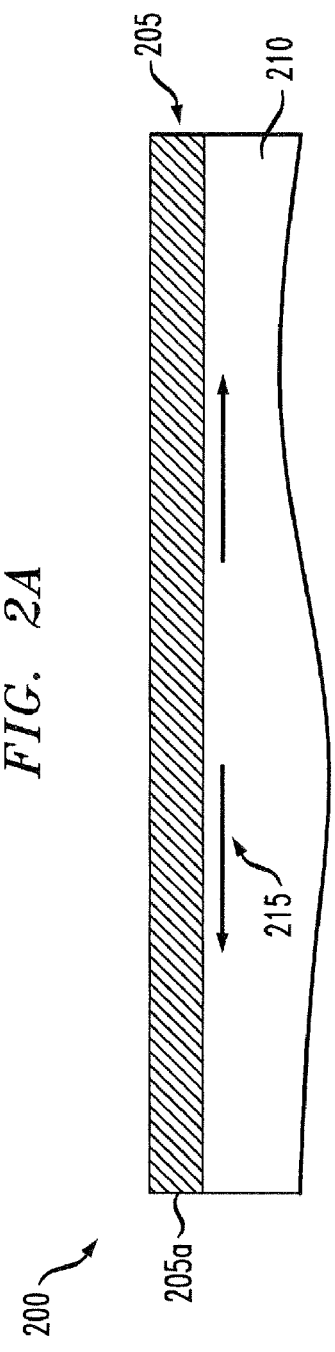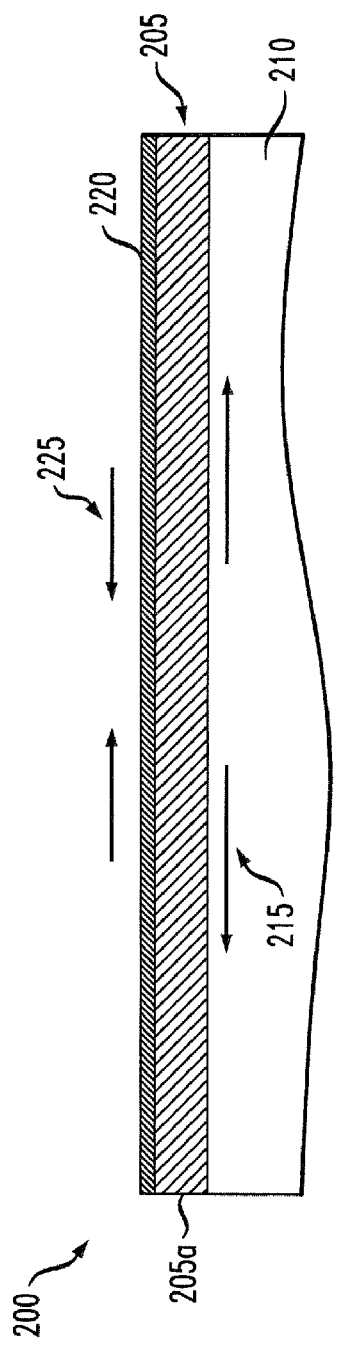

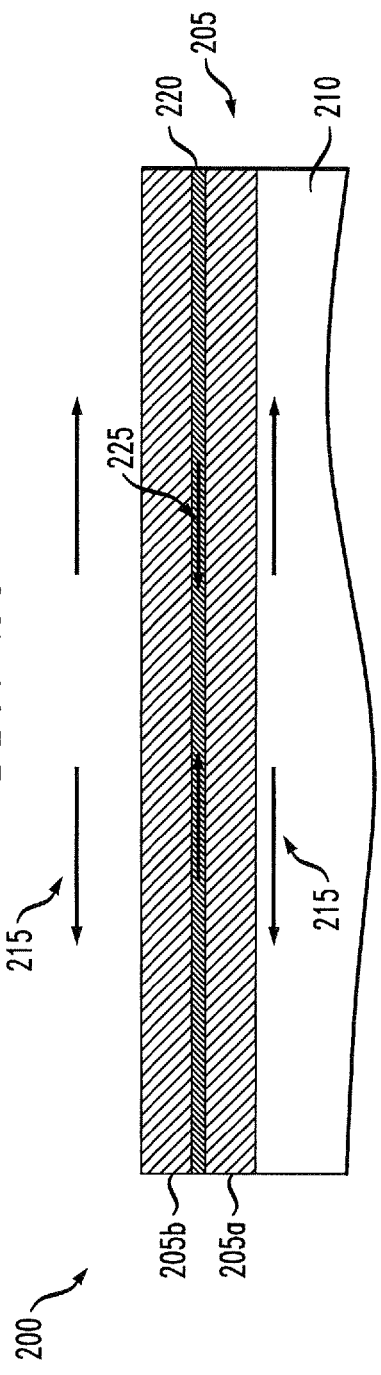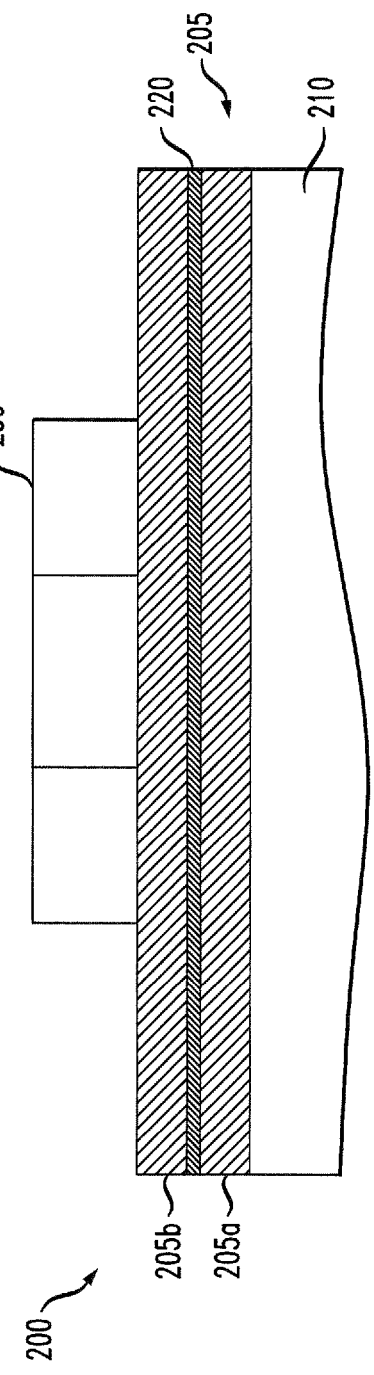

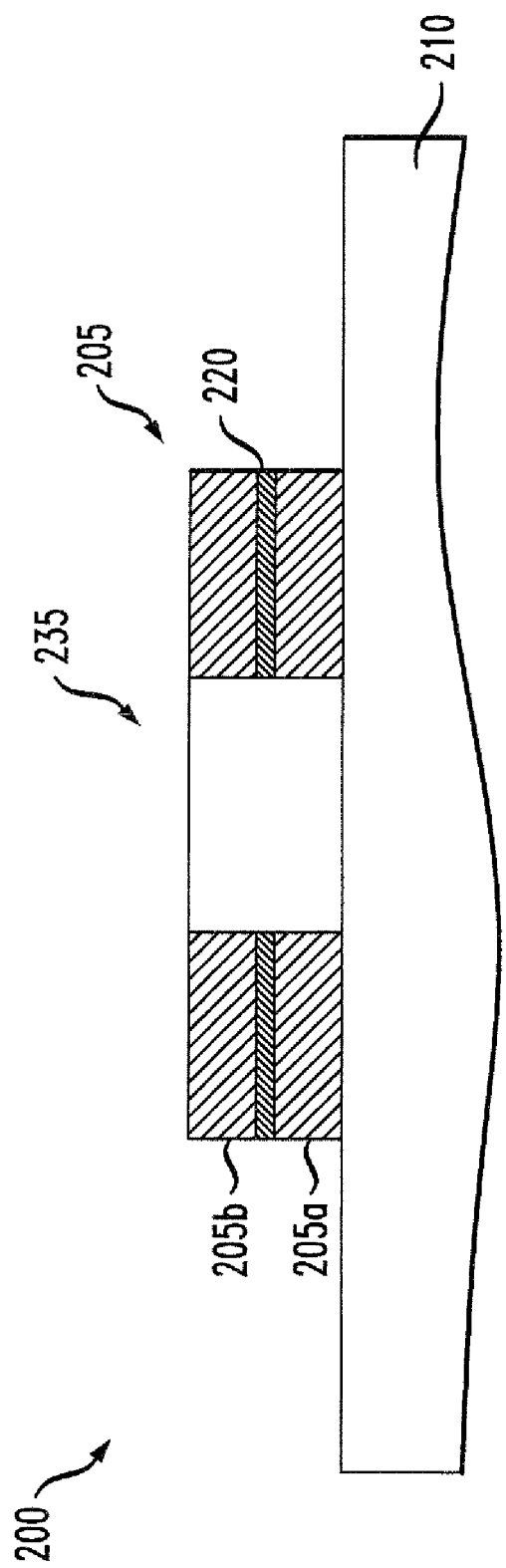

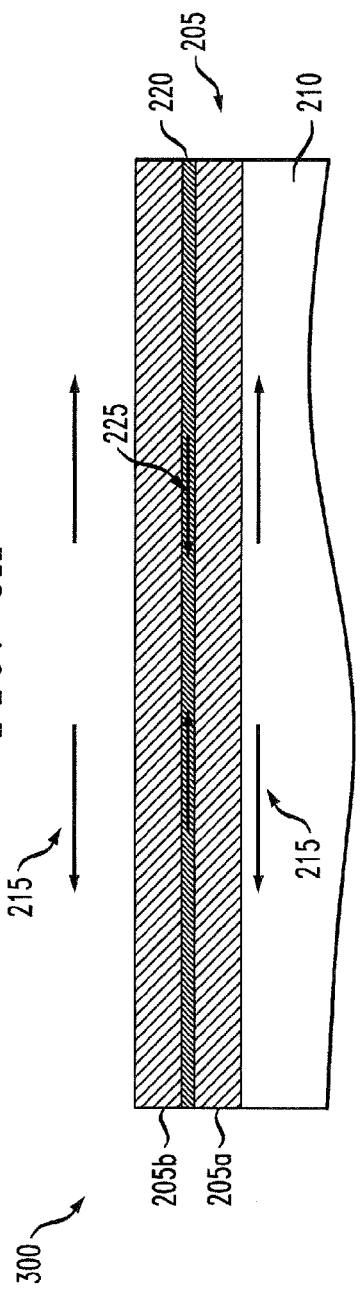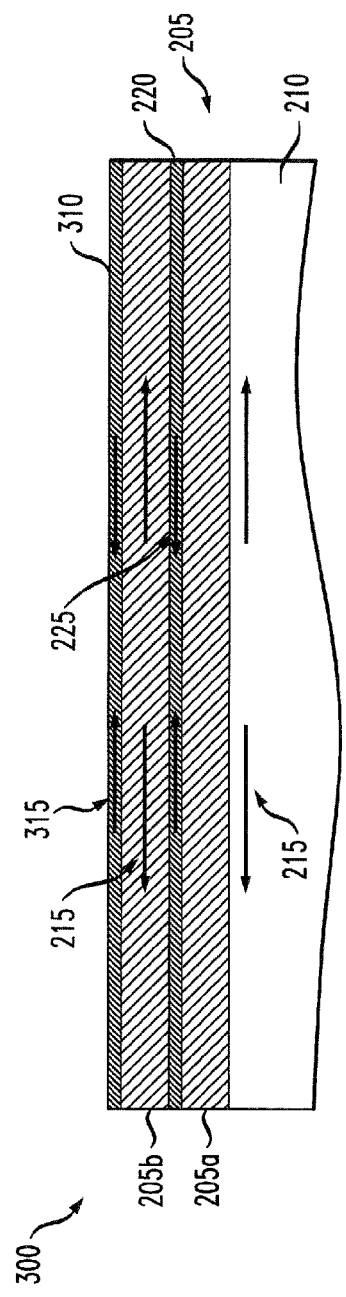

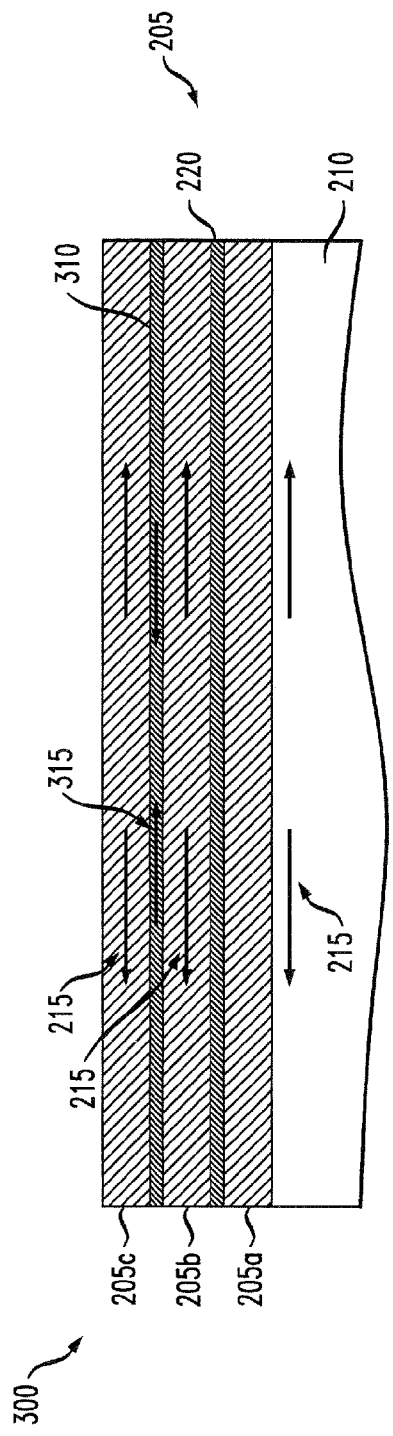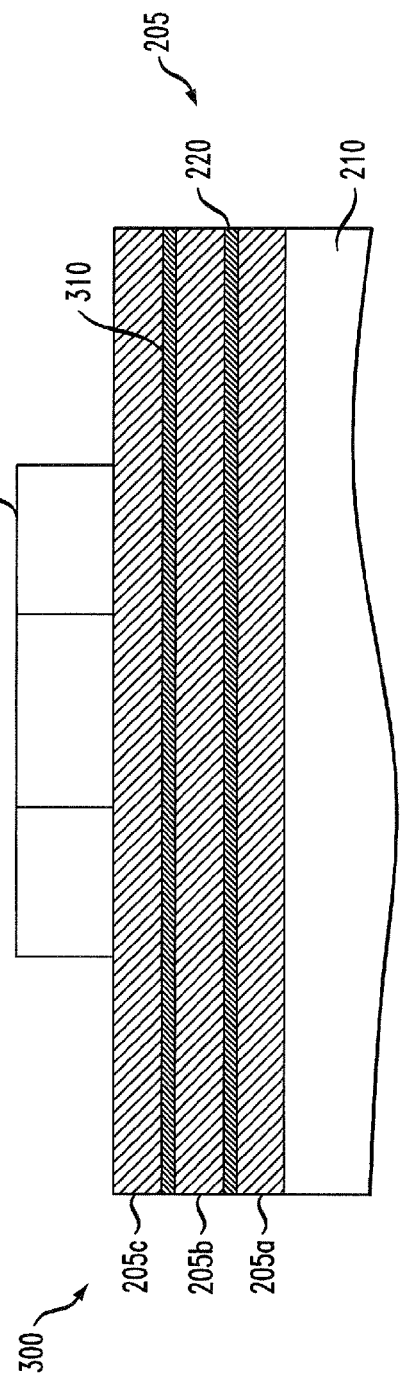

METHOD TO IMPROVE METAL DEFECTS IN SEMICONDUCTOR DEVICE FABRICATION

TECHNICAL FIELD OF THE INVENTION

The invention is directed, in general, to a method of manufacturing a semiconductor device and, more specifically, to a method that improves metal defects in a thick deposited metal.

BACKGROUND OF THE INVENTION

Optimization of semiconductor devices continues to be an important goal for the semiconductor industry. Such optimization schemes often include incorporating large scale components, such as inductors, onto the same chip on which the transistors are made. Typically, these large scale devices require the deposition of thicker metals than those used to form other components, such as interconnects, in the semiconductor device. For example, in forming inductors, metal thickness can reach thicknesses of about 1 to 3 microns.

Unfortunately, during the deposition of these thick metal layers, metal defects can occur. Due to the thickness that must be achieved, the wafer is exposed to plasma for a longer period of time that results in higher and up-trend wafer temperatures. When the wafer is finally cooled down at the end of the deposition process, the thick metal will often contract and the resulting force will cause metal defects. These metal defects are very undesirable in that they can affect yield and cause reliability issues.

To address these problems, the semiconductor industry has attempted to adjust the thermal budgets used during the deposition of thick metal layers by breaking the deposition process into two or three separate steps. For example, the metal deposition is conducted for a period of 10 minutes and then discontinued to allow the substrate to cool down. Then, the metal deposition is continued for another 10 minutes with a cool down period at the end of that deposition cycle. This is continued until the full thickness of the metal layer is achieved. While these processes have reduced the number of defects to some degree, they have not fully addressed the issue in that metal defects are still observed.

Accordingly, there is a need to provide a process by which thick layers may be deposited while avoiding the problems associated with the conventional processes discussed above.

SUMMARY OF THE INVENTION

To address the above-discussed deficiencies, the invention provides, in one embodiment, a method of manufacturing a semiconductor device. This embodiment comprises providing a semiconductor substrate and depositing a metal layer over the semiconductor substrate. The metal layer has an overall thickness of about 1 micron or greater. The method of depositing this metal layer includes depositing a first portion the metal layer, which has a compressive or tensile stress associated therewith over the semiconductor substrate. A stress-compensating layer is deposited over the first portion, such that the stress-compensating layer has a stress associated with it that is opposite to the compressive or tensile stress associated with the first portion. A second portion of the metal layer is then deposited over the stress-compensating layer. In one embodiment, this method may be used to manufacture an integrated circuit (IC) that has an inductor incorporated therein.

The foregoing has outlined one embodiment the invention so that those skilled in the art may better understand the detailed description of the invention that follows. Additional embodiments and features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which:

FIGS. 2A-2E illustrates various steps of manufacturing one embodiment of a semiconductor component provided by the invention;

FIGS. 3A-3E illustrate various steps of manufacturing another embodiment of a semiconductor component provided by the invention.

DETAILED DESCRIPTION

Figure 1:
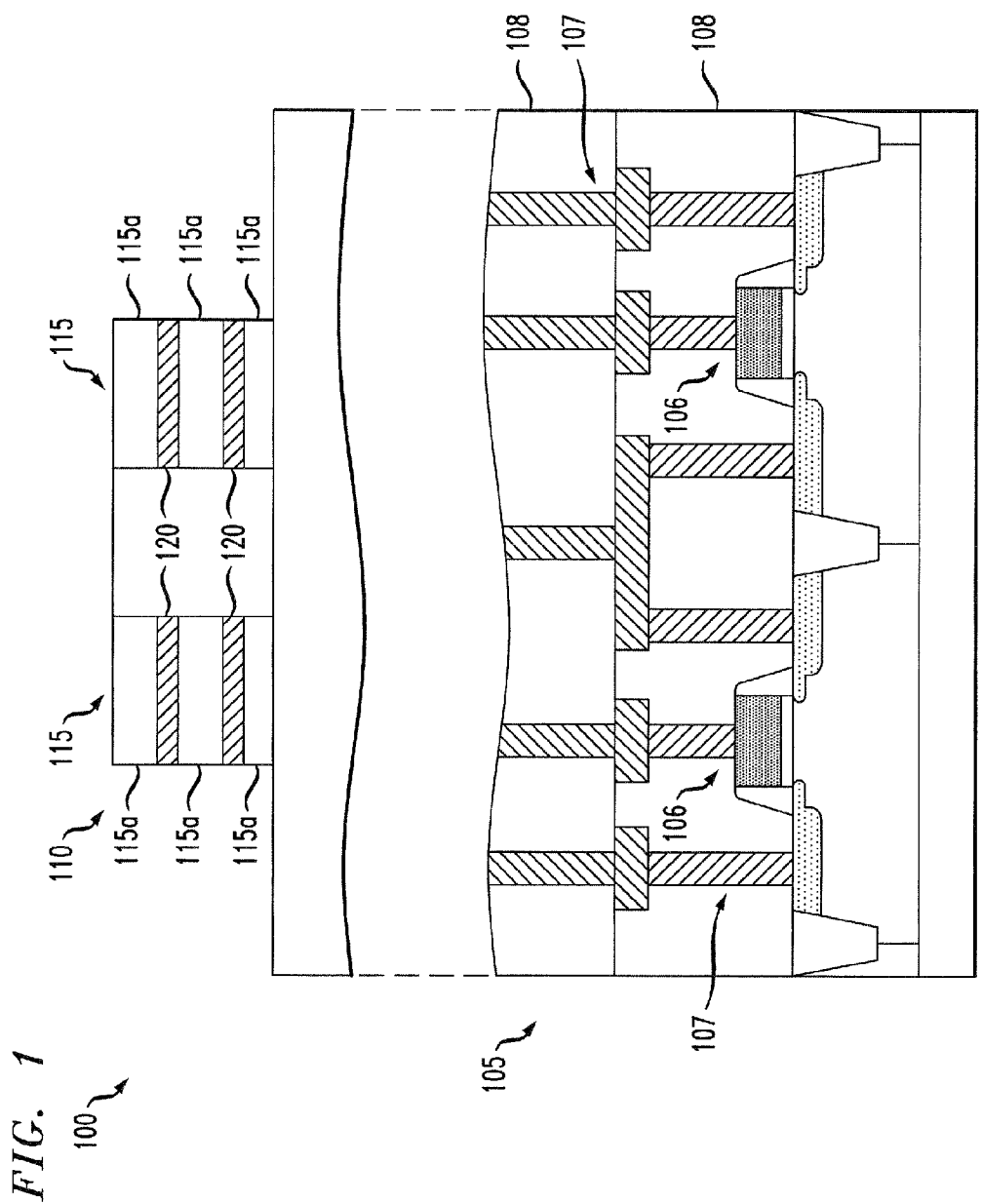
FIG. 1 illustrates a semiconductor device as provided by one embodiment of the invention.

Referring initially to FIG. 1, there is illustrated a general, partial view of a semiconductor device 100 as provided by the invention. In this embodiment, the semiconductor device 100 includes a transistor region 105 that may be of conventional design and manufactured with conventional processes and materials. As such, the transistor region includes conventional transistors 106, interconnects 107, and dielectric layers 108. Also included is a semiconductor component 110, such as an inductor. The invention's application is not limited to an inductor, however, and it should be noted that any semiconductor component that requires a thick metal deposition of about 1 micron or more is also within the scope of the invention. Additionally, the semiconductor component 110 may be located at any level of the semiconductor device 100. In the illustrated embodiment, the semiconductor component 110 is located at or near the outermost dielectric layer 110, and just prior to the final interconnect level within the device.

In the illustrated embodiment, the inductor component 110 includes a segmented metal layer 115 that has an intervening stress-compensating layer 120 located between segmented portions 115a of the metal layer 115. Thus, the overall stress is compensated throughout the deposition by inserting this stress-compensating layer 120 or layers at different stages. In most embodiments, the portions 115a will have the same metallic composition, which includes alloys thereof. However, in other embodiments, the portions 115a may be comprised of different metals or alloys, but whatever the composition of the metal or alloy, it is preferably different from the metal or alloy composition of the stress-compensating layer 120. As seen in this embodiment, the metal layer 115 contains first, second and third portions 115a with a stress-compensating layer 120 located between the first and second portions 115a and the second and third portions 115a of the metal layer 115.

The invention recognizes that controlling the thermal budget as discussed above is not sufficient to adequately reduce the number of metal defects that occur in metal layers having a thickness of about 1 micron or more. The invention also recognizes that a cause of the metal defects may be attributable to the compressive or tensile stress associated with the thick metal layer upon its deposition. It is further recognized that significant reduction in metal defects in such metal layers can be achieved by segmenting the metal layer into separate layer portions and placing a stress-compensating layer between those portions. The stress-compensating layer 120 is deposited in a way such that it has an associated stress opposite to that of the metal layer 115. The stress-compensating layer 120 will in effect counter the inherent stress within the metal and lessen or eliminate the occurrence of metal defects.

FIG. 2A illustrates an enlarged view of one embodiment of the upper portion of a semiconductor device 200 that may be employed in the semiconductor device 100 of FIG. 1 at one stage of manufacture. In FIG. 2A, a first portion 205*a* of a metal layer 205 is deposited over a dielectric layer 210. The total thickness of the metal layer 205 at the end of the deposition cycle should be about 1 micron or more. At this stage, a conventional barrier layer (not shown), such as titanium/titanium nitride (Ti/TiN) or tantalum/tantalum (Ta/TaN) may be located between the dielectric layer 210 and the first portion 205*a*. The barrier layer may have a thickness of about 60 nm.

The first portion 205*a* of the metal layer 205 may be deposited using conventional deposition processes, such as physical vapor deposition (PVD). In one embodiment, the deposition parameters may include using an aluminum target and sputtering in an inert gas, such as argon, that has a flow ranging from about 10 sccm to about 30 sccm, at a pressure ranging from about 2500 mTorr to about 8500 mTorr, and at a power ranging from about 4000 to about 12000 watts. The depositional conditions of the first portion 205*a* causes a stress 215 to be incorporated into the first portion 205*a*. Here the stress 215 is shown to be tensile, but the stress may also be compressive. In certain embodiments, the stress of the first portion 205*a* may range from about 1E8 to 5E9 Pascals. The metal layer 205 may be comprised of any conductive metal, alloy, or any other conductive material that is suitable for making a semiconductor device. For example, the metal layer 205 may be aluminum, or in other embodiments, it may be copper, gold, silver platinum, or palladium, to name just a few.

The thickness of the first portion 205*a* will depend on the overall, final thickness of the metal layer 205 and the number of portions into which the metal layer 205 is ultimately divided. For example, the thickness of each portion of the metal layer 205 may range from about 0.3 microns to 1.5 microns. In the embodiment illustrated in FIG. 2A, the metal layer 205 is to be divided into two portions having a total thickness of about 1.4 microns. Thus, the thickness of the first portion 205*a* will be about 0.70 microns.

As seen in FIG. 2B, following the deposition of the first portion 205*a*, a stress-compensating layer 220 is deposited over the first portion 205*a*. In an advantageous embodiment, the stress-compensating layer 220 is a single layer, however, it may also be a stack of layers; this may be the case for all embodiments of the invention. The stress-compensating layer 220 is deposited in a way to cause it to have a stress 225 that is opposite the stress of the underlying first portion 205*a*. For instance, if the first portion 205*a* has a tensile stress, then the stress-compensating layer 220 will be deposited to have a compressive stress. On the other hand, if the first portion 205*a* has a compressive stress, then the stress-compensating layer 220 will be deposited to have a tensile stress. Conventional processes may be used to deposit the stress-compensating layer 220. In one advantageous embodiment, a sputtering process is used to deposit this layer. For example, a titanium target may be used, and an inert gas, such as Argon, may be flowed with nitrogen to form a TiN layer. An example of a flow rate for the Argon may range from about 5 sccm to about 30 sccm. The flow rates for the nitrogen may also be from about 5 sccm to about 30 sccm. Further examples of one embodiment include conducting the sputter process at a pressure ranging from about 2500 mTorr to about 8500 mTorr and at a power ranging from about 2000 watts to about 8000 watts. These deposition parameters can result in a stress-compensating film where the stress ranges from about 1E10 Pascals to about 3E10 Pascals. Moreover, those who are skilled in the art will understand how to vary the deposition parameters to achieve a film having either a compressive stress or tensile stress associated with it.

The presence of the stress-compensating layer 220 provides advantages over prior art processes and devices. For example, it has been found with the invention that the counter stress provided by the stress-compensating layer 220 significantly reduces the number of metal defects that can form when a single thick metal layer is deposited. As such, with implementation of the invention, product reliability and yield can be increased. In addition, because the semiconductor device 100 is moved from the chamber used to deposit the metal layer 205 to the chamber used to deposit the stress-compensating layer 220, the first portion 205*a* has an opportunity to inherently cool down, which also aides in the reduction of metal defect formation.

In FIG. 2C, a second portion 205*b* of the metal layer 205 is deposited over the stress-compensating layer 220. In an advantageous embodiment, the second portion 205*b* has the same metallic or metallic alloy composition as the first portion 205*a* and the same processes may also be used to deposit the second portion 205*b*. In such instances, the second portion 205*b* may also have the same type of stress 215 associated with it as is associated with the first portion 205*a*, or alternatively, it may have an opposite stress associated with it. Due to the presence of the underlying stress-compensating layer 220, it is believed that the stress 225 that is imparted to the first portion 205*a* may also be imparted to the second portion 205*b*. Regarding the materials, other embodiments do not preclude the use of different materials in forming the second portion 205*b*.

In the embodiment shown in FIG. 2C, the deposition of the second portion 205*b* completes the total thickness of the metal layer 205, and in an advantageous embodiment, the thickness of the second portion 205*b* will be approximately the same as the first portion 205*a*. For example, if the targeted metal thickness is of the metal layer 205 is 1.4 microns, the first and second portions 205*a* and 205*b* will each have a thickness of approximately 0.70 microns. It should be understood, however, that the thicknesses of the first and second portions 205*a* and 205*b* need not be the same; one may be thicker than the other and still be within the scope of the invention. However, their individual thicknesses will total the targeted thickness of the metal layer 205.

Upon the completion of the deposition of metal layer 205 and the stress-compensating layer 220, a photoresist layer 230 is deposited and patterned as shown in FIG. 2D, and a conventional etch may be conducted to form the semiconductor component 235 as shown in FIG. 2E. As mentioned above, in one embodiment, the semiconductor component 235 may be an inductor.

FIG. 3A illustrates another embodiment of the semiconductor component 300, as provided by the invention, that may be employed in the semiconductor device of FIG. 1. In this embodiment, additional layers of metal and stress-compensating layers are deposited as described below. In achieving the structure shown in FIG. 3A, the same processes and materials used to construct the device shown in FIG. 2C may be used to build the structure illustrated in FIG. 3A. As such, the same reference numbers are used.

Following the deposition of the second portion 205b, and unlike the embodiment of FIG. 2C, the total thickness of the metal layer 205 has not yet been achieved. Thus, in the embodiment illustrated in FIG. 3B, another stress-compensating layer 310 is deposited over the second portion 205b. This stress-compensating layer 310 may have the same composition as the stress-compensating layer 220, and it may also have a thickness of about 50 nm. As such, the same processes and materials as those described above may be used to form the stress-compensating layer 310. In an advantageous embodiment, the stress-compensating layer 310 will have a stress 315 associated with it that is opposite to the stress 215 as described above regarding the embodiment shown in FIG. 2C. This counter stress further reduces the formation of metal defects in the second portion 205b.

Following the deposition of the stress-compensating layer 310, a third portion 205c of the metal layer 205 is deposited over the stress-compensating layer 310. In this embodiment, the deposition of the third portion 205c completes the total thickness of metal layer 205. In an advantageous embodiment, the third portion 205c has the same metallic or metallic alloy composition as the first and second portions 205a and 205b and the same processes may also be used to deposit the third portion 205c. In such instances, the third portion 205c may also have the same type of stress 215 associated with it as is associated with the first and second portions 205a and 205b. Due to the presence of the underlying stress-compensating layer 310, it is believed that the stress 315 that is imparted to the second portion 205b may also be imparted to the third portion 205c. Regarding the materials, other embodiments do not preclude the use of different materials in forming the third portion 205c.

In the embodiment shown in FIG. 3C, the deposition of the third portion 205c completes the total thickness of the metal layer 205, and in an advantageous embodiment, the thickness of the third portion 205c will be approximately the same as the thicknesses of the first and second portions 205a and 205b. For example, if the targeted metal thickness of the metal layer 205 is 1.45 microns, the first, second and third portions 205a, 205b, and 205c will each have a thickness of approximately 0.45 microns. It should be understood, however, that the thicknesses of the first, second, and third portions 205a, 205b, and 205c need not be the same; one may be thicker than the others or they may all have different thicknesses and still be within the scope of the invention. However, their individual thicknesses will total the targeted thickness of the metal layer 205. Furthermore, in this as well as other embodiments, the various portions of the metal layer 205 may all have the same type of stress associated with each one, or the portions may be deposited in such a way such that the type of stress in each portion alternates with the other. Likewise, the stress-compenstating layer 310 located between each portion may also alternate with other stress-compensating layers. Thus, in certain embodiments, the overall stack may comprise layers that have alternating types of stress associated with them. Given the teachings herein, one who is skilled in the art would understand how to alternate the deposition parameters to achieve this type of alternating stress pattern.

Figure 3E:
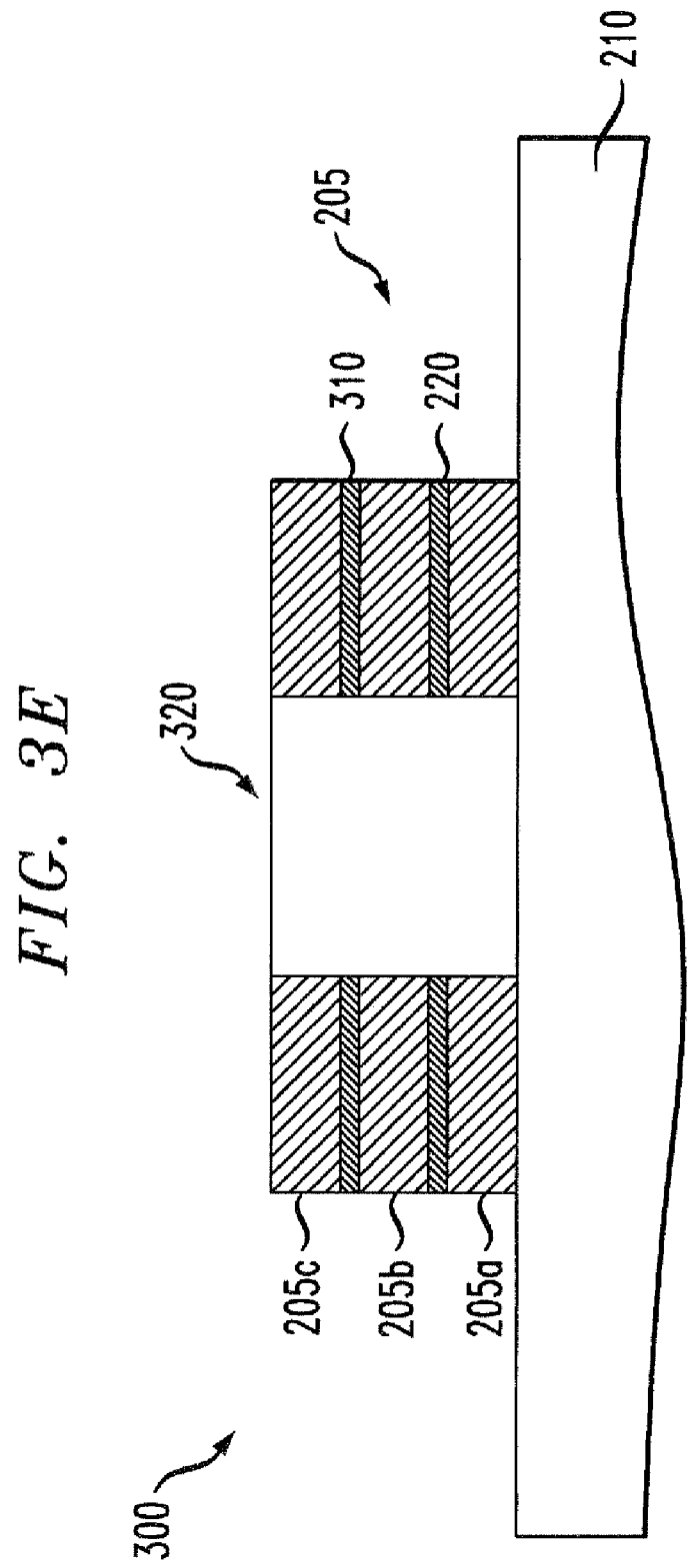

Upon the completion of the deposition of metal layer 205 and the stress-compensating layers 220 and 310, a photoresist layer 315 is deposited and patterned as shown in FIG. 3D, and a conventional etch may be conducted to form the semiconductor component 320 as shown in FIG. 3E. As mentioned above, in one embodiment, the semiconductor component 320 may be an inductor. While the above embodiments have described the metal layer being segmented into only two or three layers with intervening stress-compensating layers located between them, it is readily recognized that the invention may be used to segment the metal layer into any number of segments with a stress-compensating layer being located between each pair of segments.

Figure 4:
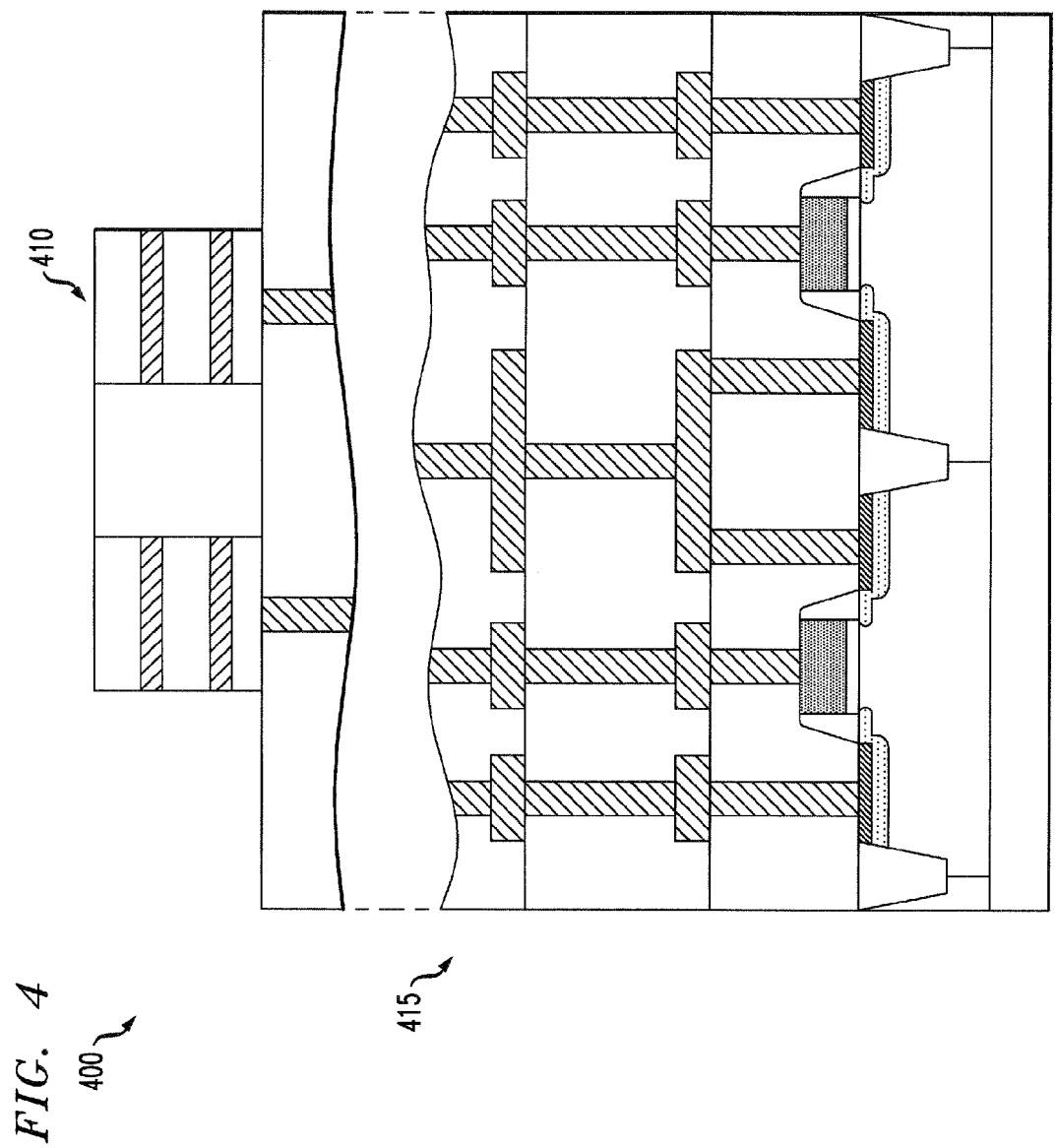
FIG. 4 illustrates a partial view of an integrated circuit as provided by the invention.

Turning briefly to FIG. 4, there is illustrated a partial view of an IC 400 that comprises a semiconductor component 410, which may be any of the above-discussed embodiment, and a conventional transistor structure 415 as the one discussed above regarding FIG. 1. The semiconductor component may be any of the embodiments as discussed above and as illustrated in FIG. 1, 2F, or 3F. The semiconductor component 410 is electrically connected to the underlying transistor structure 415 by conventional structures, the details of which are not shown. It should also be understood that those who are skilled in the art would understand how to complete the IC 400 to form an operative IC.

By segmenting a thick metal layer and placing stress-reducing layers between those segments, the invention provides both a process and device that incurs fewer metal defects in the thick metal layer than the conventional processes and devices that are discussed above. As a result, product yields and product reliability are increased.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device formed over a semiconductor substrate, comprising:
    depositing a metal layer over a dielectric layer formed over the semiconductor substrate, the metal layer having an overall thickness of about 1 micron or greater, the metal layer formed by:
        depositing a first portion of the metal layer over the dielectric layer, the first portion having a compressive or tensile stress associated therewith;
        placing a stress-compensating layer over the first portion, such that the stress-compensating layer has a stress opposite to the compressive or tensile stress associated with the first portion;
        depositing a second portion the metal layer over the stress-compensating layer; and
        depositing and patterning a photoresist layer over the second portion of the metal layer; and
    etching the metal layer to form the semiconductor device such that any remaining first portion of the metal layer remains entirely in contact with the dielectric layer.

2. The method recited in claim 1, wherein the stress-compensating layer includes a metal selected from Group 4 or 5 of the Periodic Table.

3. The method recited in claim 2, wherein the stress-compensating layer comprises titanium, tantalum, titanium nitride, tantalum nitride, or combinations thereof.

4. The method recited in claim 1, wherein the metal layer comprises aluminum, copper, gold, silver, platinum, palladium, or combinations thereof.

5. The method recited in claim 1, wherein the stress-compensating layer is a first stress-compensating layer and the method further includes depositing a second stress-compensating layer over the second portion, the second stress-compensating layer having a stress that is opposite to a compressive or tensile stress associated with the second portion, and depositing a third portion of the thickness, over the second stress-compensating layer.

6. The method recited in claim 5, wherein a thickness of each of the first, second and third portions ranges from about 0.3 microns to about 0.8 microns.

7. The method recited in claim 5, wherein different deposition parameters are used to from the first and second stress-compensating films.

8. The method recited in claim 1, wherein the deposition parameters used to form the first and second portions include using an aluminum target and sputtering in an inert gas, such as argon, that has a flow ranging from about 10 sccm to about 30 sccm, at a pressure ranging from about 2500 mTorr to about 8500 mTorr, and at a power ranging from about 4000 to about 12000 watts.

9. The method recited in claim 1, wherein depositing a second portion includes depositing a remaining portion to a predetermined thickness.

10. The method recited in claim 1, wherein the metal layer is patterned to form an inductor for an integrated circuit.

11. The method recited in claim 1, wherein the first portion has a stress associated therewith that ranges from about 1E8 to about 5E9 Pascals, and the stress-compensating layer has an opposite stress to that of the first portion that ranges from about 1E10 to about 3E10 Pascals.

12. The method recited in claim 1, wherein placing a stress-compensating layer includes using a titanium target and flowing an inert gas with nitrogen to form a TiN layer wherein the inert gas is flowed at a flow rate ranging from about 5 sccm to about 30 sccm and the nitrogen is flowed at a rate ranging from about 5 sccm to about 30 sccm and at a pressure ranging from about 2500 mTorr to about 8500 mTorr and at a power ranging from about 2000 watts to about 8000 watts.

13. The method recited in claim 1, wherein the stress-compensating layer is a first stress-compensating layer and the integrated circuit further includes a second stress-compensating layer over the second portion, and a third portion of the metal is located over the second stress-compensating layer.

14. A method of manufacturing an integrated circuit, comprising:
forming transistors over a semiconductor substrate;
forming dielectric layers over the transistors;
forming interconnects in the dielectric layers that electrically connect the transistors; and
forming an inductor over one of the dielectric layers, including:
depositing a metal layer over the semiconductor substrate, the metal layer having an overall thickness of about 1 micron or greater, the metal layer formed by:
depositing a first portion of the thickness of the metal layer over the one of the dielectric layers, the first portion having a compressive or tensile stress associated therewith;
placing a stress-compensating film over the first portion of the thickness of the metal layer, such that the stress-compensating film imparts a stress to the first portion opposite to the compressive or tensile stress associated with the first portion;
depositing a second portion of the thickness of the metal layer over the stress-compensating film; and
depositing and patterning a photoresist layer over the second portion of the thickness of the metal layer; and
etching the metal layer to form the inductor such that any remaining first portion of the thickness of the metal layer remains entirely in contact with the one of the dielectric layers.

15. The method recited in claim 14, wherein the stress-compensating layer comprises titanium, tantalum, titanium nitride, tantalum nitride, or combinations thereof.

16. The method recited in claim 14, wherein the metal layer comprises aluminum, copper, gold, silver, platinum, palladium, or combinations thereof.

17. The method recited in claim 14, wherein the stress-compensating layer is a first stress-compensating layer and the method further includes depositing a second stress-compensating layer over the second portion, the second stress-compensating layer imparting a stress on the second portion that is opposite to a compressive or tensile stress associated with the second portion, and depositing a third portion of the thickness, over the second stress-compensating layer.

18. The method recited in claim 17, wherein a thickness of each of the first, second and third portions ranges from about 0.3 microns to about 0.8 microns.

19. The method recited in claim 17, wherein deposition parameters used to form the first and second portions include using an aluminum target and sputtering in an inert gas, such as argon, that has a flow ranging from about 10 sccm to about 30 sccm, at a pressure ranging from about 2500 mTorr to about 8500 mTorr, and at a power ranging from about 4000 to about 12000 watts.

20. The method recited in claim 14, wherein placing a stress-compensating layer includes using a titanium target and flowing an inert gas with nitrogen to form a TiN layer wherein the inert gas is flowed at a flow rate ranging from about 5 sccm to about 30 sccm and the nitrogen is flowed at a rate ranging from about 5 sccm to about 30 sccm and at a pressure ranging from about 2500 mTorr to about 8500 mTorr and at a power ranging from about 2000 watts to about 8000 watts.

21. An integrated circuit, comprising:
transistors located over a semiconductor substrate;
dielectric layers located over the transistors;
interconnects located over or within in the dielectric layers that electrically connect the transistors; and
an inductor located over one of the dielectric layers comprising metal layer having a combined thickness of about 1 micron or greater, the metal layer including:
a first portion of the metal layer;
a stress-compensating layer located over the first portion; and
a second portion of metal layer located over the stress-compensating layer, wherein any remaining portion first portion of the metal layer remains entirely in contact with the one of the dielectric layers.

22. The integrated circuit recited in claim 21, wherein the stress-compensating layer comprises titanium, tantalum, titanium nitride, tantalum nitride, or combinations thereof and the metal layer comprises aluminum, copper, gold, silver, platinum, palladium, or combinations thereof.

23. A method of manufacturing an integrated circuit, comprising:
forming transistors over a semiconductor substrate;
forming dielectric layers over the transistors;
forming interconnects in the dielectric layers that electrically connect the transistors; and
forming an inductor over one of the dielectric layers, including:
depositing a metal layer over the semiconductor substrate, the metal layer having an overall thickness of about 1 micron or greater, the metal layer remaining in contact with the semiconductor substrate and including:
depositing a first portion of the thickness of the metal layer over the semiconductor substrate, the first portion having a compressive or tensile stress associated therewith;
placing a first stress-compensating layer over the portion of the thickness of the metal layer, such that the first stress-compensating layer imparts a stress to the first portion opposite to the compressive or tensile stress associated with the first portion;
depositing a second portion of the thickness of the metal layer over the first stress-compensating layer;
depositing a second stress-compensating layer over the second portion, the second stress-compensating layer imparting a stress on the second portion that is opposite to a compressive or tensile stress associated with the second portion; and
depositing a third portion of the thickness over the second stress-compensating layer.

* * * * *